US010305452B2

(12) United States Patent
Quiquempoix et al.

(10) Patent No.: US 10,305,452 B2
(45) Date of Patent: May 28, 2019

(54) FIVE-LEVEL SWITCHED-CAPACITANCE DAC USING BOOTSTRAPPED SWITCHES

(71) Applicant: Microchip Technology Incorporated, Chandler, AZ (US)

(72) Inventors: Vincent Quiquempoix, Divonne les bains (FR); Fabien Vaucher, Lausanne (CH)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 16/138,156

(22) Filed: Sep. 21, 2018

(65) Prior Publication Data

US 2019/0097609 A1  Mar. 28, 2019

Related U.S. Application Data

(60) Provisional application No. 62/564,770, filed on Sep. 28, 2017.

(51) Int. Cl.
| | |
|---|---|
| *H03M 1/06* | (2006.01) |
| *H03M 1/80* | (2006.01) |
| *H03H 19/00* | (2006.01) |
| *H03M 3/00* | (2006.01) |

(52) U.S. Cl.
CPC ........ *H03H 19/004* (2013.01); *H03M 1/0663* (2013.01); *H03M 1/804* (2013.01); *H03M 3/502* (2013.01)

(58) Field of Classification Search
CPC .... H03H 19/004; H03M 1/804; H03M 3/502; H03M 1/0663

USPC ......................................................... 341/155
See application file for complete search history.

(56) References Cited

U.S. PATENT DOCUMENTS

| | | | |
|---|---|---|---|
| 7,102,558 B2 | 9/2006 | Deval | 341/150 |
| 7,994,958 B2 | 8/2011 | Quiquempoix et al. | 341/150 |
| 8,981,973 B2 * | 3/2015 | Kumar | H03M 1/0617 |
| | | | 341/118 |

(Continued)

OTHER PUBLICATIONS

Lee, Tsung-Sum et al., "Design Techniques for Low-Voltage Micropower CMOS Switched-Capacitor Delta-Sigma Modulator," IEEE Asia-Pacific Conference on Circuits and Systems, pp. 249-252.

(Continued)

*Primary Examiner* — Brian K Young
(74) *Attorney, Agent, or Firm* — Slayden Grubert Beard PLLC

(57) ABSTRACT

A charge transfer digital-to-analog converter includes a differential reference voltage, a pair of capacitors, and switches including a shorting switch. The switches are configured to be switched in successive phases to generate a charge transfer through the capacitors to generate an output corresponding to a digital input. The specific switches activated and deactivated in each phase are selected according to the digital input. Each capacitor of the pair of capacitors is connected to a respective pin for the output. The shorting switch is configured to short the pair of capacitors to create a zero-differential charge on a first side of the capacitors. The shorting switch is implemented with a bootstrap circuit to maintain a constant common mode voltage of the first side of the capacitors while the shorting switch is activated.

20 Claims, 4 Drawing Sheets

(56) References Cited

U.S. PATENT DOCUMENTS

| | | | |
|---|---|---|---|
| 8,988,263 B2* | 3/2015 | Zhan | H03M 1/46 |
| | | | 341/118 |
| 9,030,346 B2* | 5/2015 | Dey | H03M 1/109 |
| | | | 341/118 |
| 9,935,648 B1* | 4/2018 | Kamble | H03M 1/466 |
| 2014/0253354 A1 | 9/2014 | Quiquempoix | 341/143 |

OTHER PUBLICATIONS

Zhao, Zhou et al., "A Gain Boosting Switch for S/H Circuit Using Clock Boosting and Symmetrical Techniques to Decrease the Effect of Channel Charge Injection," IEEE International Conference on Computational Problem Solving, pp. 308-311.

Meng, Xin et al., "Bootstrapping Techniques for Floating Switches in Switch-Capacitor Circuits," IEEE International Midwest Symposium on Circuits and Systems, pp. 398-401.

International Search Report and Written Opinion, Application No. PCT/US2018/053007, 17 pages.

* cited by examiner

| DAC INPUT | SWITCHES ON IN PHASE 1 | SWITCHES ON IN PHASE 2 | CHARGE TRANSFER IN PHASE 1 | CHARGE TRANSFER IN PHASE 2 | DAC OUTPUT (PHASE 2- PHASE 1) |
|---|---|---|---|---|---|
| 2 | S2 | S1 | -Cdac*Vref | +Cdac*Vref | +2Cdac*Vref |
| 1 | S2 | S3 | -Cdac*Vref | 0 | +Cdac*Vref |
|   | S3 | S1 | 0 | +Cdac*Vref |  |
| 0 | S3 | S3 | 0 | 0 | 0 |
|   | S2 | S2 | -Cdac*Vref | -Cdac*Vref | 0 |
|   | S1 | S1 | +Cdac*Vref | +Cdac*Vref | 0 |
| -1 | S3 | S2 | 0 | -Cdac*Vref | -Cdac*Vref |
|   | S1 | S3 | +Cdac*Vref | 0 |  |
| 2 | S1 | S2 | +Cdac*Vref | -Cdac*Vref | -2Cdac*Vref |

US 10,305,452 B2

FIVE-LEVEL SWITCHED-CAPACITANCE DAC USING BOOTSTRAPPED SWITCHES

PRIORITY

The present application claims priority to U.S. Provisional Patent Application No. 62/564,770 filed Sep. 28, 2017, the contents of which are hereby incorporated in their entirety.

FIELD OF THE INVENTION

The present disclosure relates to digital-to-analog conversion and, more particularly, to a five-level switched-capacitance digital-to-analog converter (DAC) using bootstrapped switches.

BACKGROUND

Analog-to-digital converters (ADC) are in widespread use today in electronics for consumers, industrial applications, etc. Typically, analog-to-digital converters include circuitry for receiving an analog input signal and outputting a digital value proportional to the analog input signal. This digital output value is typically in the form of either a parallel word or a serial digital bit string. There are many types of analog-to-digital conversion schemes such as voltage-to-frequency conversion, charge redistribution, delta modulation, as well as others. Typically, each of these conversion schemes has its advantages and disadvantages. One type of analog-to-digital converter that has seen increasing use is the switched capacitor-based sigma-delta converter. Such converters may utilize several charge-transfer DACs in feedback.

SUMMARY

Embodiments of the present disclosure include a charge transfer DAC which may include a differential reference voltage, a pair of capacitors, and switches including a shorting switch. The switches may be configured to be switched in successive phases to generate a charge transfer through the capacitors to generate an output corresponding to a digital input, wherein the specific switches activated and deactivated in each phase are selected according to the digital input. Each capacitor of the pair of capacitors may be connected to a respective pin for the output. The shorting switch may be configured to short the pair of capacitors to create a zero-differential charge on a first side of the capacitors. The shorting switch may be implemented with a bootstrap circuit to maintain a constant common mode voltage of the first side of the capacitors while the shorting switch is activated. In combination with any of the above embodiments, the DAC may further include a voltage follower circuit configured to provide input into the shorting switch. In combination with any of the above embodiments, the voltage follower circuit may be configured to receive as an input a midpoint voltage of the differential reference voltage. In combination with any of the above embodiments, the voltage follower circuit may be configured to generate a follow voltage that matches the common mode voltage of the pair of capacitors. In combination with any of the above embodiments, the voltage follower circuit is configured to provide sufficient current to bias a transistor of the shorting switch. In combination with any of the above embodiments, the voltage follower circuit may be a wire connecting the shorting switch with a midpoint of a voltage divider for the differential reference voltage. In combination with any of the above embodiments, during a startup phase, a midpoint voltage of the differential reference voltage may be applied to each of the pair of capacitors to define the common mode voltage. In combination with any of the above embodiments, during a startup phase, differential nodes of the differential reference voltage may be applied to the pair of capacitors to define the common mode voltage. In combination with any of the above embodiments, the shorting switch may include a transistor configured to control a connection between an input pin and an output pin, the input pin and the output pin connected to respective ones of the pair of capacitors. In combination with any of the above embodiments, the input pin and the output pin may be isolated from the bootstrap circuit. In combination with any of the above embodiments, the bootstrap circuit may be configured to control a gate of the transistor to control the connection between the input pin and the output pin. In combination with any of the above embodiments, the DAC may further include a voltage follower circuit configured to provide input into the shorting switch. In combination with any of the above embodiments, the shorting switch may include a transistor configured to control a connection between respective ones of the pair of capacitors. In combination with any of the above embodiments, the input from the voltage follower circuit into the shorting switch may be configured to be input into the bootstrap circuit and to be isolated from the output. In combination with any of the above embodiments, the shorting switch may include a transistor configured to control a connection between an input pin and an output pin, the input pin and the output pin connected to respective ones of the pair of capacitors. In combination with any of the above embodiments, the ADC may include reset switches connecting a midpoint of the differential reference voltage and the input pin and the output pin, wherein the reset switches are configured to be engaged to equalize voltages of the input pin and the output pin to the midpoint of the differential reference voltage during a reset phase. In combination with any of the above embodiments, the shorting switch may be configured to maintain symmetry of differential inputs on the first side of the capacitors. In combination with any of the above embodiments, the symmetry may be defined by a same impedance seen at each first side of the capacitors so that a differential charge remains constant during switching of the capacitors when the shorting switch is enabled.

Embodiments of the present disclosure may include an ADC including any of the above embodiments of a DAC in a feedback configuration. The DAC may be configured to provide a feedback to an analog loop filter, the filter configured to accept an analog voltage input and output to a quantizer. The quantizer may be configured to output a bitstream and output to the DAC.

Embodiments of the present disclosure may include an apparatus, integrated circuit, chip, microcontroller, system on a chip (SoC), system, or device including any of the embodiments of a DAC described above.

Embodiments of the present disclosure may include methods performed by any of the DACs, ADCs, apparatuses, integrated circuits, chips, microcontrollers, SoCs, systems, or devices of the above embodiments.

DETAILED DESCRIPTION

Figure 1:
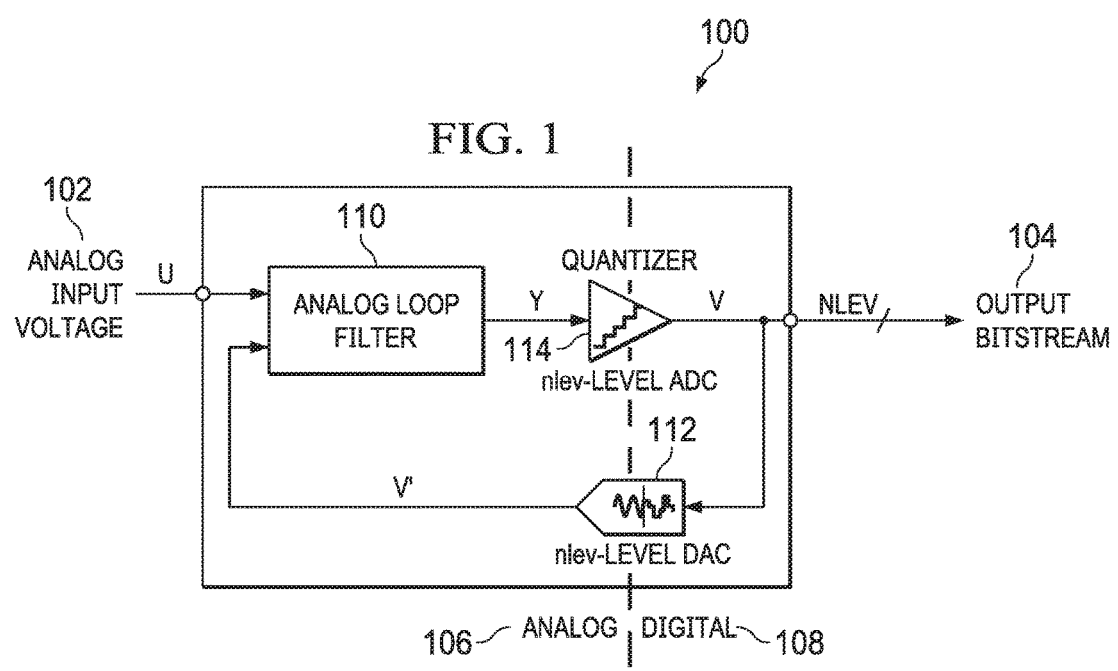
FIG. 1 is an illustration of an nlev-level DAC implemented within an ADC, according to embodiments of the present disclosure.

FIG. 1 is an illustration of an nlev-level DAC 112 implemented within an ADC 100, according to embodiments of the present disclosure. Although DAC 112 is shown as-used in ADC 100, DAC 112 may be used in any suitable application. DAC 112 may be a multi-bit DAC, include any suitable number of levels greater than two (number of bits greater than one). In one embodiment, the DAC resolution may be 5-level. DAC 112 may be implemented as a charge transfer DAC.

In one embodiment, DAC 112 may be implemented using bootstrapped switches. DAC 112, through its use of bootstrapped switches, may be configured to improve settling times and charge injection effects. Embodiments of the present disclosure may use bootstrapped switches, rather than CMOS switches. As a result, linearity, input voltage range, temperature range, and distortion may be improved. This may occur because the input charge injection is no longer a function of the input voltage, and because the gate voltage of such bootstrapped switches is always maximized and do not vary with the input voltage. DAC 112 using bootstrap switches may lead to a lower ADC distortion due to constant gate-to-source voltage (VGS) on the DAC switches which makes charge injection effects resulting as an offset error on the ADC output and not as a distortion error.

In ADC 100, an analog input voltage 102 may be received to be converted to a digital value represented by output bitstream 104. Implementation of ADC 100 may include representation in an analog domain 106 and a digital domain 108. ADC 100 may be implemented using a switched capacitor-based sigma-delta converter. ADC 100 may be implemented as a charge-based converter. ADC 100 may include an analog loop filter 110, a quantizer 114, and DAC 112. Analog loop filter 110 and quantizer 114 may be implemented by any suitable combination of analog or digital circuitry, application specific integrated circuits, field-programmable gate arrays, or combination thereof. DAC 112 may be implemented according to the teachings of the present disclosure.

Analog input voltage 102 may be input as signal U and fed to analog loop filter 110. The output signal Y of analog loop filter 110 may be forwarded to quantizer 114 which may be configured to provide the output digital bitstream V representing a digital value of analog input voltage 102. V may be a multi-bit bitstream. V may be connected to the input of DAC 112. The output of DAC 112, analog output V' (which may be the analog conversion of V through DAC) may be fed back to analog loop filter 110.

As discussed above, DAC 112 may be preferably implemented with a multi-level DAC. A multi-level DAC may be chosen rather than a 2-level (or single-bit) DAC as such a choice may increase converter resolution, induce less quantization noise, induce a better stability of the modulator and therefore a better dynamic range and less sensitivity to idle tones as well as better distortion behavior. A multiple-level implementation of quantizer 114 may be possible as such an implementation does not require as much accuracy as DAC 112. Since the output of DAC 112 resides at the input of ADC 100, the inaccuracies of DAC 112 are directly transmitted to the input signal and may be difficult to compensate since analog loop filter 110 cannot filter and decorrelate DAC output and analog input signals during its process. A five level, inherently linear DAC can be built with only one pair of capacitors and five switches. This is shown, for example, in U.S. Pat. No. 7,102,558 B2.

Switching within DAC 112 may be controlled by any suitable logic, digital circuitry, analog circuitry, or any combination thereof. Control signals to switches in DAC 112 may be set according to a generation rate for the conversion.

Figure 2:
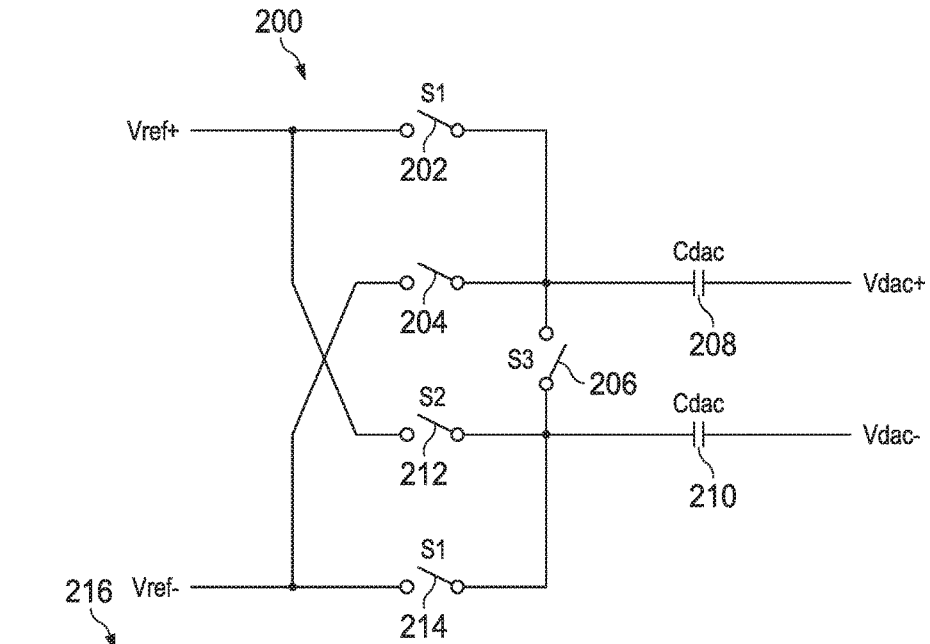
FIG. 2 is an illustration of an example 5-level, single capacitor pair DAC

FIG. 2 is an illustration of an example 5-level, single capacitor pair DAC 200. DAC 200 may partially implement DAC 112.

DAC 200 may include a single pair of capacitors 208, 210. Capacitors 208, may each have a capacitance of Cdac. DAC 200 may include input voltages Vref+ and Vref−, and output voltages VDAC+ and VDAC−. DAC 200 may include switches 202, 204, 206, 212, 214. Switches 202, 204, 206, 212, 214 may operate in two phases. The first phase may be denoted P1, and the second phase may be denoted P2. P1 and P2 may be non-overlapping phases. P1 and P2 may be used in a sigma-delta converter to sample and transfer charges within the modulator. Switches 202, 214 may be operated in the same manner with a common control logic signal referred to as S1. Switches 204, 212 may be operated in the same manner with a common control logic signal, referred to as S2. Switch 206 may be operated by a control logic signal referred to as S3. The specific switches that are to be activated or kept open in a given phase may depend upon the intended input of the DAC, a given phase, only one set of switches (S1, S2, or S3) are enabled at the same time, as the other two switches may be off. In each phase, the selected switch may be based on the bitstream to be transmitted.

Table 216 illustrates example operation of DAC 200. In sigma delta converters, capacitive charge transfer DACs such as DAC 200 may be used to realize the feedback of the modulator if the modulator is made of switched capacitors. Five different levels, corresponding to +2/+1/0/−1/−2 times Cdac times the voltage differential ($V_{ref+}-V_{ref-}$) as the differential charge that is transferred, may be asserted in two phases. In each of the two phases, there may be one sample taken and one charge transfer performed in the signal delta modulator. The table illustrates voltage levels of input to the DAC. The charge transferred in phase one for such an input is shown, as well as the charge transferred in phase two for such an input. The resulting DAC output is also shown. If there is no mismatch between the capacitor pair, then there may be inherently linear DAC performance over the 5-levels of charge transferred.

However, if switches 202, 204, 206, 212, 214 are implemented in CMOS, as standard CMOS pass-gate switches (parallel combination of NMOS and PMOS), the bandwidth of the DAC may be degraded at low temperatures and at Vref common-mode voltage (Vref++Vref−)/2 close to VDD/2. Slow process corners create dynamic issues such as distortion. Charge injection may not be linear when switches are turned off since VGS is not constant for each switch. Additionally, the input common mode may need to be defined properly if switch 206 (representing S3) is on at first sampling. Therefore, a constant VGS for the switches and proper handling of the input common mode at first sampling may be required to maintain performance over a large common-mode range and large temperature range.

Figure 3:
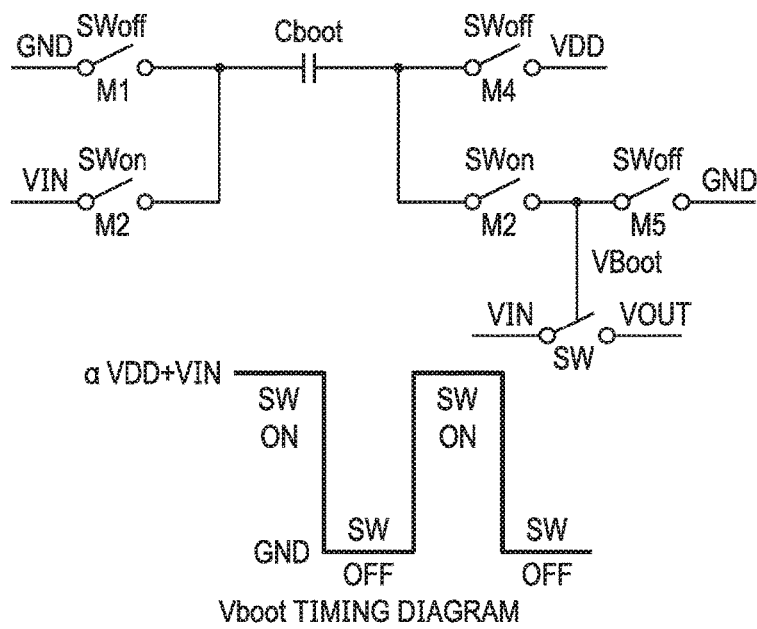
FIG. 3 is an illustration of an example bootstrap switch, according to embodiments of the present disclosure.

FIG. 3 is an illustration of an example bootstrap switch 300, according to embodiments of the present disclosure. Switch 300 may be used to implement switches 202, 204, 212, 214. In one embodiment, a further modification of switch 300 may be used to implement switch 206, discussed below within the context of FIG. 4 and FIG. 5.

Use of bootstrapped switches may avoid distortion. In switch 300, switch SW may be a main switch performing the operation of switch 300. Switch SW may be implemented by, for example, an NMOS transistor. Switch 300 may include switches M1, M2, M3, M4, and M5. Switch 300 may include a bootstrap capacitor Cboot.

Switch SW may be controlled by a logic signal from a remainder of the bootstrapped circuit. Operation of switch 300 may be controlled through a control signal, which may be "SWon". The converse of SWon may be "SWoff". When switch 300 is to be enabled, SWon may be a logical one and SWoff may be a logical zero. Which switch 300 is to be disabled, SWon may be a logical zero and SWoff may be a logical one.

Switches M1, M4, and M5 may be controlled by SWoff. Switches M2 and M3 may be controlled by SWon. Switch M1 may be connected to ground and to a first plate or side of Cboot. Switch M3 may be connected to Vin (which is connected to a first plate of Cdac 208 in FIG. 2, in turn connected to Vdac+ n its second plate). Switch M4 may be connected to a supply voltage, VDD, and to a second plate of Cboot. Switch M5, SW, and switch M2 may be connected to a common node, whose voltage may be denoted as Vboot. Switch M2 may also be connected to the second plate of Cboot. Switch M5 may also be connected to ground. SW may connect Vin and Vout (which is connected to a first plate of Cdac 210 in FIG. 2, in turn connected to Vdac− on its second plate).

The bootstrap portions of switch 300 may be configured to provide a gate voltage for SW that is dependent upon Vin such that the VGS is constant and maximized. When this goal is attained, the on-resistance of the switch is minimized and not dependent upon input voltage. In FIG. 3, bootstrapping may be performed in two phases. The phases may be non-overlapping. A first phase may include SWon being a logic zero or low and SWoff being a logic one or high. A second phase may include SWoff being a logic zero or low and SWon being a logic one or high. Vboot is shown as going from ground to $(\alpha*VDD+Vin)$.

In the first phase, SWoff is logic high, meaning that SW is itself off. The Cboot may be precharged during this phase to a maximum VDD voltage. This precharge may be performed by the switching action of M1 and M4. During the precharge phase, the main switch, SW, is kept off through switch M5 driving the gate of SW to ground.

In the second phase, SWon is logic high, meaning that SW is itself on. Activation of M2 and M3 results in connection of Cboot to both Vin and the gate of SW. This may cause the gate voltage, Vboot, to be (VDD+Vin) since the charge of Cboot remains basically unchanged from the first phase. In this case, the VGS of SW is constant, maximal, and equal to VDD.

In implementations, the charge of Cboot may not be perfectly maintained between the on and off phases. As a result, Cboot may be subject to losses due to parasitic capacitances of switches attached to Cboot. The efficiency of the charging Cboot may be given as $\alpha$ and may be within a range of zero to one, wherein one represents perfect efficiency. The factor $\alpha$ may be made close to one if the Cboot capacitance value is much larger than the parasitic capacitances of the switches. The charge transfer may be impacted by such parasitics such that a gate voltage, Vboot, for SW may be $(\alpha*VDD+Vin)$. The bootstrapping technique may avoid VGS variation and make charge injection constant and not vary with Vin. Since VGS is maximized, the on-resistance (Ron) of the switch is then minimized, and bandwidth is maximized. The charge injection can be further minimized by reducing the width of the main switch which will, in this case, reduce the bandwidth linearly by increasing Ron linearly.

Accordingly, in one embodiment, one or more of switches 202, 204, 206, 212, 214 may be implemented with a bootstrapped technique shown in FIG. 3, wherein Vin of the voltage of the switch can be either Vref+ or Vref−.

However, using such an implementation for the switch 206 may induce additional undesired effects rendering it inefficient. Switch M3 may render switch 206 asymmetrical, if implemented according to FIG. 3, as the parasitic capacitances on Vin and Vout are not equal as in a standard CMOS switch implementation of switch 206. M3, as a voltage follower, may induce additional charge injection and may induce an additional leakage current path on the voltage Vin. Therefore, in one embodiment modifications of this bootstrap switch implementation may be made to recover symmetry and avoid any leakage path on the Vin voltage and avoid any additional charge injection. In a further embodiment, switch 206, the main switch to short the surfaces of capacitors 208, 210 together, may be implemented with a modified kind of bootstrap circuit as shown in FIG. 4.

Figure 4:
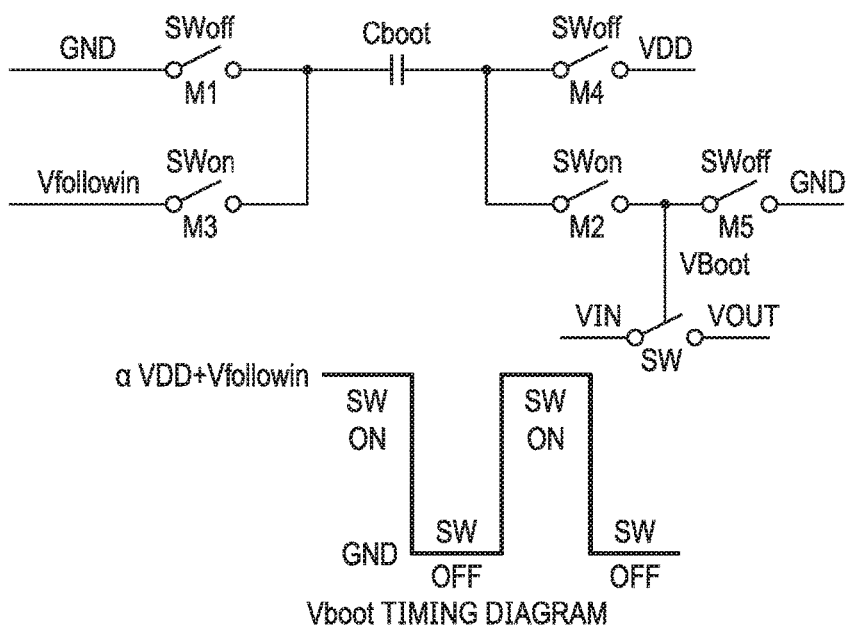
FIG. 4 is an illustration of an example bootstrap circuit configured to avoid leakage paths on voltage inputs, according to embodiments of the present disclosure.

FIG. 4 is an illustration of an example bootstrap circuit 400 configured to avoid leakage paths on voltage inputs, according to embodiments of the present disclosure. Circuit 400 may modify circuit 300 as shown in the figure and described below. Circuit 400 may be symmetrical and avoid effects of switch M3 connected to Vin as shown in FIG. 3.

M3 might not be directly connected to Vin, but rather to another voltage, Vfollowin. Vfollowin may be another input to circuit 400. Voltage Vin may be unmodified by M3. In FIG. 4, Vboot voltage may be equal to $(\alpha*VDD+Vfollowin)$ during the on phase of SW. If Vfollowin is equal to Vin, then the same Vboot voltage can be created with the operations of the switches.

Figure 5:
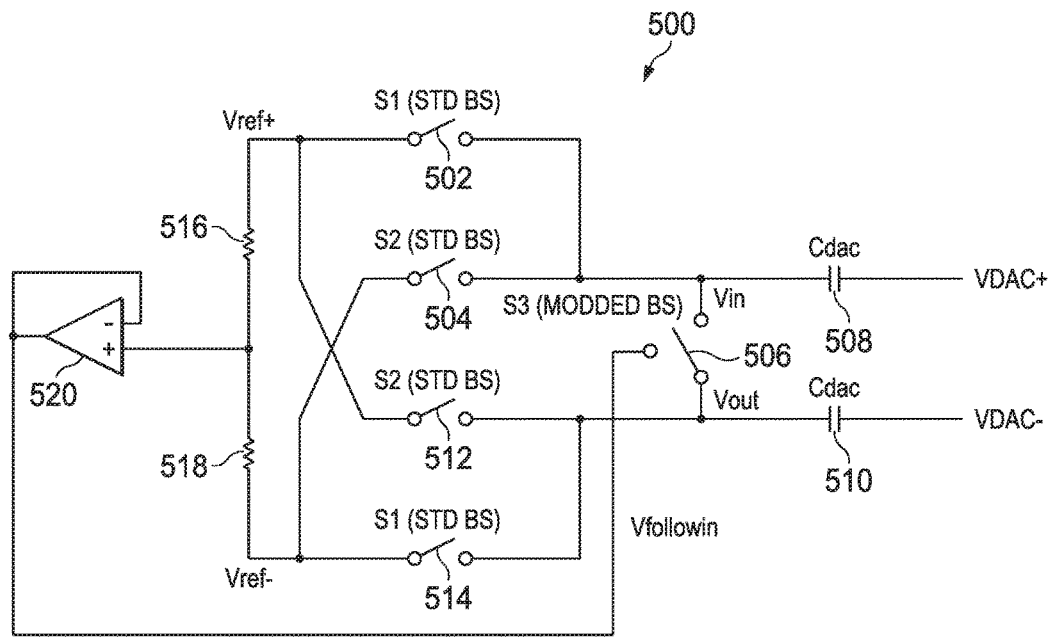
FIG. 5 is an illustration of an example DAC using a modified bootstrap circuit, according to embodiments of the present disclosure.

FIG. 5 is an illustration of an example DAC 500 using a modified bootstrap circuit, according to embodiments of the present disclosure. DAC 500 may further implement DAC 200 and DAC 112. DAC 500 may include one or more bootstrap switches to implement, for example, switch 506.

Switch 506 may also be referenced as S3 and may be implemented by the modified bootstrap switch 400 of FIG. 4. Switch 506 may correspond to S3 of FIG. 2. Switches 502, 514 may also be referenced as S1 and switched together, corresponding to S1 of FIG. 2. Switches 502, 514 may be implemented by the bootstrap switch 300 of FIG. 3. Switches 504, 512 may also be referenced as S2 and switched together, corresponding to S2 of FIG. 2. Switches 502, 514 may be implemented by the bootstrap switch 300 of FIG. 3. DAC 500 may include a pair of capacitors 508, 510 each with a value of Cdac, each output to Vdac+ and Vdac−. DAC 500 may receive inputs Vref+ and Vref−. Switch 506 may receive a Vfollowin input from an output of a voltage follower 520.

In one embodiment, DAC 500 may include a voltage follower 520. Voltage follower 520 may be a unity gain buffer. Voltage follower 520 may be configured to transfer its input to its output unchanged. Voltage follower 520 may be denoted as a voltage "follower" in that its output voltage follows its input voltage. While voltage follower 520 may provide a voltage gain of, ideally, one, it may provide a current boost. Voltage follower 520 may be configured to prevent portions of DAC 500 from receiving its output from loading portions of DAC 500 connected to its input. Voltage follower 520 may be implemented with an op-amp and a feedback loop from its output to its input.

In one embodiment, voltage follower 520 may have as its other input (as compared to the feedback loop) a voltage from a midpoint of a voltage divider. The midpoint voltage may be given as VCMVref=((Vref+)+(Vref−)/2). The voltage divider may include resistors 516, 518 connected as in series together. Resistors 516, 518 may have matched impedances. The voltage divider may be connected between Vref+ and Vref−. In various embodiments, other implementations of providing a divided voltage to voltage follower 520 may be used.

For switch 506, voltage connected to capacitor 508 may be a first input, or Vin. Voltage connected to capacitor 510 may be a second input, or Vout. In one embodiment, voltage follower 520 may be configured to output a voltage denoted as Vfollow_in, representing the followed voltage. In another embodiment, Vfollow_in may be an additional, third input to switch 506. In yet another embodiment, switch 506 may be implemented with a modified bootstrap circuit. Vfollow_in may be used as an input to the bootstrap circuit of switch 506. For example, Vfollow_in may be sued as an input of the M3 switch in FIG. 4 to the bootstrap circuit of switch 506.

In one embodiment, voltage follower 520 may be configured to provide sufficient current to bias Vfoflow_in in switch 506. Vfollow_in may be at the same voltage as the common mode voltage of Vref+ and Vref− for capacitors 508, 510. In another embodiment, voltage follower 520 may be replaced by a simple wire connected to the resistive divider generating the midpoint voltage. This configuration is preferred for size and power consumption optimization but can impact bandwidth if the midpoint voltage settling time is large compared to the P1 or P2 phases of the sigma-delta modulator.

Switch 506 may be configured to short capacitors 508, 510 together, as these are connected to Vin and Vout, respectively. This may create zero differential input voltage. However, the top plates of capacitors 508, 510 may have a high impedance. Accordingly, without the features of the embodiments of the present disclosure, the common mode may drop due to a requirement for input current with the switches on. In contrast, bootstrapped switch 506 may have no current pulled from capacitors 508, 510 but yet the common mode may be maintained when switch 506 is on. Thus, loss of charge on capacitors 508, 510 may be avoided when switch 506 is on while bootstrapping is still used.

As per the teachings of this invention, the Vin and Vout of the shorting switch 506 should be properly defined before input switch 506 is enabled as these voltages are essentially high impedance during a phase where S3 is on. In one embodiment, one can ensure this by having a first phase where S1 or S2 can be enabled and then charging the Vin and Vout of S3 so that common-mode voltage at the inputs of the capacitors is defined when the capacitors are shorted through S3.

Figure 6:
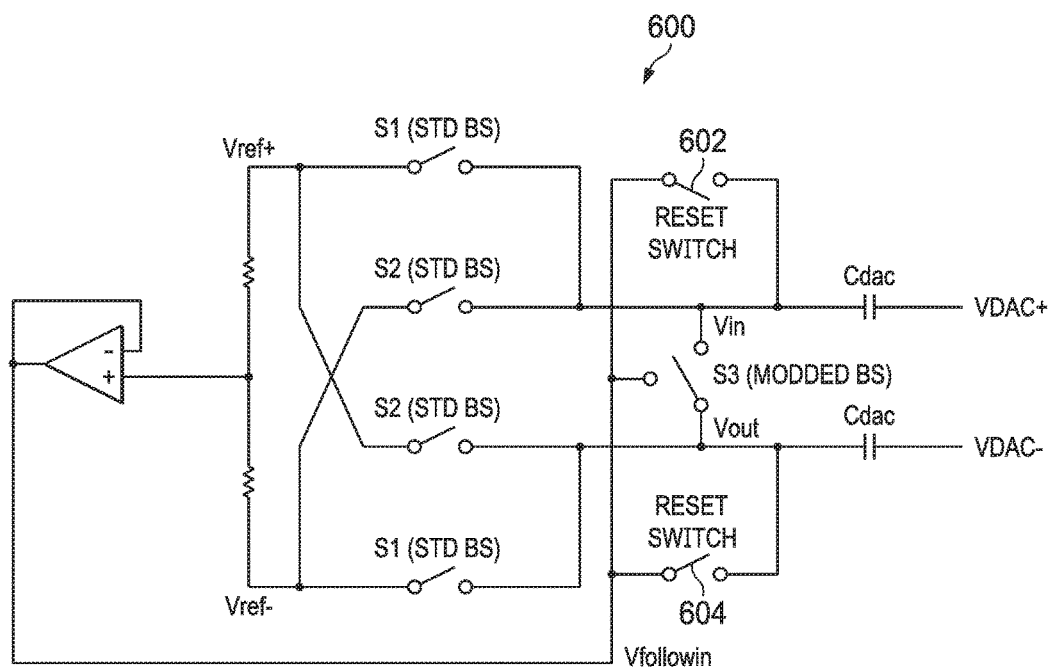
FIG. 6 is an illustration of further details of an example DAC using a modified bootstrap circuit and additional reset switches, according to embodiments of the present disclosure.

FIG. 6 is an illustration of further details of an example DAC 600 using a modified bootstrap circuit and additional reset switches, according to embodiments of the present disclosure. DAC 600 may otherwise be implemented according to DAC 500 of FIG. 5.

DAC 600 may include a reset switch 602 and a reset switch 604, each connected between Vfollow_in and respective ones of Vin and Vout. Reset switches 602, 604 may be implemented as, for example, CMOS switches. Reset switches 602, 604 may be enabled in a first phase (typically the reset phase of the ADC) so that the voltages Vin and Vout are equal to Vfollowin during this reset phase. Reset switches 602, 604 may be disabled, or open during the rest of the operation. Furthermore, reset switches 602, 604 may be enabled periodically to remove or otherwise address leakage current. In addition, reset switches 602, 604 may be enabled whenever S3 is on. This implementation also properly defines the common-mode ((Vin+Vout)/2) of the switch 506 and avoids switching with a floating common-mode if S3 is enabled in the reset phase of the ADC.

Although example embodiments have been described above, other variations and embodiments may be made from this disclosure without departing from the spirit and scope of these embodiments.

We claim:

1. An apparatus, comprising:
  a charge transfer digital-to-analog converter (DAC), the DAC comprising:
    a differential reference voltage;
    a pair of capacitors;
    a plurality of switches including a shorting switch; and
    wherein:
      the plurality of switches are configured to be switched in successive phases to generate a charge transfer through the capacitors to generate an output corresponding to a digital input, wherein the specific switches activated and deactivated in each phase are selected according to the digital input;
      each capacitor of the pair of capacitors is connected to a respective pin for the output;
      the shorting switch is configured to short the pair of capacitors to create a zero-differential charge on a first side of the capacitors; and
      the shorting switch is implemented with a bootstrap circuit to maintain a constant common mode voltage of the first side of the capacitors while the shorting switch is activated.

2. The apparatus of claim 1, further comprising a voltage follower circuit configured to provide input into the shorting switch.

3. The apparatus of claim 2, wherein the voltage follower circuit is configured to receive as an input a midpoint voltage of the differential reference voltage.

4. The apparatus of claim 2, wherein the voltage follower circuit is configured to generate a follow voltage that matches the common mode voltage of the pair of capacitors.

5. The apparatus of claim 2, wherein the voltage follower circuit is configured to provide sufficient current to bias a transistor of the shorting switch.

6. The apparatus of claim 2, wherein the voltage follower circuit is a wire connecting the shorting switch with a midpoint of a voltage divider for the differential reference voltage.

7. The apparatus of claim 1, wherein during a startup phase, a midpoint voltage of the differential reference voltage is applied to each of the pair of capacitors to define the common mode voltage.

8. The apparatus of claim 1, wherein during a startup phase, differential nodes of the differential reference voltage are applied to the pair of capacitors to define the common mode voltage.

9. The apparatus of claim 1, wherein:
the shorting switch includes a transistor configured to control a connection between an input pin and an output pin, the input pin and the output pin connected to respective ones of the pair of capacitors;
the input pin and the output pin are isolated from the bootstrap circuit.

10. The apparatus of claim 8, wherein the bootstrap circuit is configured to control a gate of the transistor to control the connection between the input pin and the output pin.

11. The apparatus of claim 1, wherein:
the apparatus further includes a voltage follower circuit configured to provide input into the shorting switch;
the shorting switch includes a transistor configured to control a connection between respective ones of the pair of capacitors; and
the input from the voltage follower circuit into the shorting switch is configured to be input into the bootstrap circuit and to be isolated from the output.

12. The apparatus of claim 1:
wherein the shorting switch includes a transistor configured to control a connection between an input pin and an output pin, the input pin and the output pin connected to respective ones of the pair of capacitors; and
further comprising reset switches connecting a midpoint of the differential reference voltage and the input pin and the output pin, wherein the reset switches are configured to be engaged to equalize voltages of the input pin and the output pin to the midpoint of the differential reference voltage during a reset phase.

13. The apparatus of claim 1, wherein the shorting switch is configured to maintain symmetry of differential inputs on the first side of the capacitors.

14. The apparatus of claim 13, wherein the symmetry is defined by a same impedance seen at each first side of the capacitors so that a differential charge remains constant during switching of the capacitors when the shorting switch is enabled.

15. A method, comprising:
switching a plurality of switches, the switches including a shorting switch, of a DAC in successive phases to generate a charge transfer through a pair of capacitors of the DAC to generate an output corresponding to a digital input;
selecting switches to activate and deactivate in the successive phases according to the digital input;
connecting each of the pair of capacitors to a respective pin for the output;
shorting, with the shorting switch, the pair of capacitors to create a zero-differential charge on a first side of the capacitors;
within a bootstrap circuit of the shorting switch, maintaining a constant common mode voltage of the first side of the capacitors while the shorting switch is activated; and
providing input into the shorting switch from a voltage follower circuit, the input a midpoint voltage of a differential reference voltage that is a follow voltage that matches the common mode voltage of the pair of capacitors and is configured to provide sufficient current to bias a transistor of the shorting switch.

16. The method of claim 15, wherein during a startup phase, the midpoint voltage of the differential reference voltage is applied to each of the pair of capacitors to define the common mode voltage.

17. The method of claim 15, wherein during a startup phase, differential nodes of the differential reference voltage are applied to the pair of capacitors to define the common mode voltage.

18. The method of claim 15, further comprising isolating an input pin and an output pin connected to the shorting switch from the bootstrap circuit.

19. The method of claim 15, further comprising maintaining symmetry of differential inputs on the first side of the capacitors wherein the symmetry is defined by a same impedance seen at each first side of the capacitors so that a differential charge remains constant during switching of the capacitors when the shorting switch is enabled.

20. The method of claim 15, further comprising equalizing voltages, the voltages of an input pin and an output pin connected to the shorting switch, to a midpoint of a differential reference voltage during a reset phase with reset switches.

* * * * *